United States Patent

[11] 3,596,203

[72] Inventors Kazuo Sakamoto;
Ryoji Tamura, both of Tokyo, Japan

[21] Appl. No. 788,577
[22] Filed Jan. 2, 1969
[45] Patented July 27, 1971
[73] Assignee Nippon Electric Company, Limited
Tokyo, Japan
[32] Priority Jan. 4, 1968
[33] Japan
[31] 43/423

[54] PLURAL TRANSISTOR HIGH FREQUENCY OSCILLATOR
11 Claims, 4 Drawing Figs.

[52] U.S. Cl. .................................................. 331/96,
331/117 D, 333/32
[51] Int. Cl. .................................................. H03b 5/18
[50] Field of Search .................................................. 331/96, 99, 101, 102, 117, 117 D, 168, 107; 333/32, 83

[56] References Cited

UNITED STATES PATENTS

| | | | |
|---|---|---|---|
| 3,243,728 | 3/1966 | Brainerd et al. | 331/117 |
| 3,252,112 | 5/1966 | Hauer | 331/107 |
| 3,397,365 | 8/1968 | Krause, Jr. et al. | 331/102 |
| 3,491,310 | 1/1970 | Hines | 331/107 X |
| 2,245,597 | 6/1941 | Lindenblad | 331/102 X |
| 3,299,371 | 1/1967 | Ryan | 331/168 X |

*Primary Examiner*—Roy Lake
*Assistant Examiner*—Siegried H. Grimm
*Attorney*—Marn and Jangarathis

ABSTRACT: Oscillator apparatus is provided in accordance with the teachings of this invention wherein the total output power as well as the power consumed thereby is equally divided among a plurality of transistor means. The resulting transistorized oscillator apparatus is particularly well adapted for high frequency, high power applications because high frequency transistor means may be appropriately utilized therein without exceeding the rated collector dissipation of such transistor means. According to one embodiment of the present invention, oscillator apparatus is described wherein a plurality of transistors are individually coupled to high Q tuned circuit means through a plurality of impedance matching means interposed between the inputs to said high Q tuned circuit means and each of said plurality of transistor means. The output of the oscillator apparatus may then be made available to a load through load matching circuit means connected to said high Q tuned circuit means. The loaded Q of the high Q tuned circuit means is selected to be sufficiently above that exhibited by said impedance matching means and said load matching circuit means so that the frequency of said oscillator means determines the oscillation frequency of said oscillator apparatus and maintains the reactive portion of the overall impedance thereof at a constant value whereby said impedance matching means may be independently adjusted to match the impedance of its respective transistor means to the impedance of high Q tuned circuit means without adversely effecting any of the other transistor means present therein.

Figure 1:
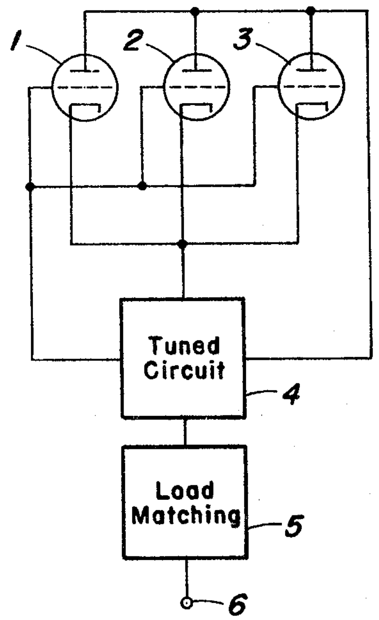
Fig. 1. PRIOR ART

INVENTORS
Kazuo Sakamoto
Ryoji Tamura
BY
Marn & Jangarathis
ATTORNEYS

INVENTORS
Kazuo Sakamoto
Ryoji Tamura
BY
Marn & Jangarathis
ATTORNEYS

PLURAL TRANSISTOR HIGH FREQUENCY OSCILLATOR

This invention relates to oscillator apparatus and more particularly to transistorized oscillator apparatus which includes a plurality of transistors and is especially adapted for high power, high frequency application.

Although transistor technology has advanced to the point wherein transistors having high frequency capabilities are readily available, transistors which readily admit of high power usages remain virtually unknown. Thus, if it is desired to employ a high frequency transistor in a high frequency and high power circuit, the small allowable collector dissipation of such transistors will always present a severe design limitation which will prevent a single transistor from handling substantial amounts of power. Therefore, if high power transistorized oscillator apparatus is required, it has been the practice to combine a plurality of transistors in parallel so that the total power output of such transistorized oscillator apparatus may be shared among each of the transistors in said plurality.

The technique of combining a plurality of active devices in parallel to obtain a combined power output from such plurality of active devices which substantially exceeds the available power output from a single active device was initially utilized in conjunction with high frequency, high power oscillator apparatus wherein the active devices relied upon were vacuum tubes. The technique of combining a plurality of vacuum tubes in parallel to obtain high frequency, high power, oscillator apparatus operated extremely well because, as the input and output impedances of vacuum tubes are large and uniform, there is substantially no interaction among the vacuum tubes connected in parallel and the impedances thereof tend to isolate them from the external circuits connected thereto.

In contrast to vacuum tubes, transistors manifest rather low input and output impedances which vary substantially from transistor to transistor. Therefore, when the technique of combining a plurality of active devices in parallel to obtain a combined power output from such plurality of active devices is applied to transistors in order to obtain high power, high frequency oscillator apparatus, the low and varying input and output impedances of the transistors utilized, renders it extremely difficult to distribute the total oscillation output power equally among the transistors connected in the parallel configuration. Furthermore, in the worst cases of imbalance, the varying impedances of the respective transistors result in the breakdown of the transistor having the lowest impedance of the plurality of transistors connected to a common power supply in the oscillator apparatus. Too alleviate the problems which stem from the low, nonuniform impedances in such plurality of transistors, it would appear expedient to insert an impedance matching circuit prior to each of the transistors connected in parallel so that the total power may be equally shared among the individual transistors. However, the use of such impedance balancing circuits do not alleviate the difficulties caused by the low, nonuniform impedances of such transistors connected in parallel because an attempt to match one of said transistors causes a mismatch in the others whereby a perfect impedance match, simultaneously in all of said transistors is virtually impossible to achieve. In addition in this form of oscillator apparatus, the insertion of impedance matching means, very often form undesired oscillatory circuits which cause such oscillator apparatus to generate undesired frequencies. Accordingly, it will be seen that the power sharing technique which was so advantageous with vacuum tube oscillator apparatus has not proved successful in application to transistorized oscillator apparatus thereby rendering the design of high power, high frequency oscillator apparatus extremely difficult.

Therefore, it is an object of the present invention to provide oscillator apparatus including a plurality of transistors connected in parallel which is particularly well adapted for high frequency, high power application.

It is a further object of this invention to provide transistorized oscillator apparatus wherein the total oscillation power output is equally shared by all of the transistors present therein and each of the transistors present therein are mutually isolated to avoid interaction therebetween.

It is an additional object of the present invention to provide stable, transistorized oscillator apparatus whose frequency is determined by tuning circuit means having an output which does not contain any undesirable, spurious oscillations.

Other objects and advantages of the invention will become clear from the following detailed description of several embodiments thereof, and the novel features will be particularly pointed out in conjunction with the appended claims.

Figure 2:
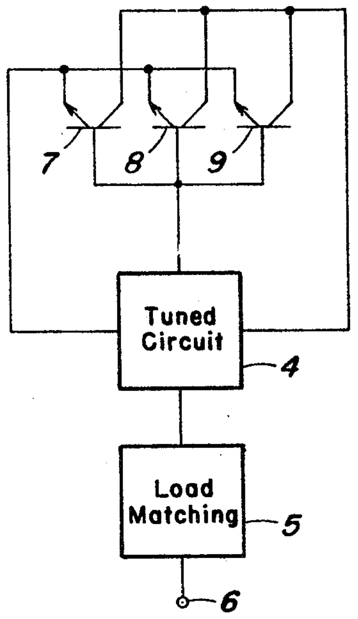
Fig. 2. PRIOR ART
Figure 3:
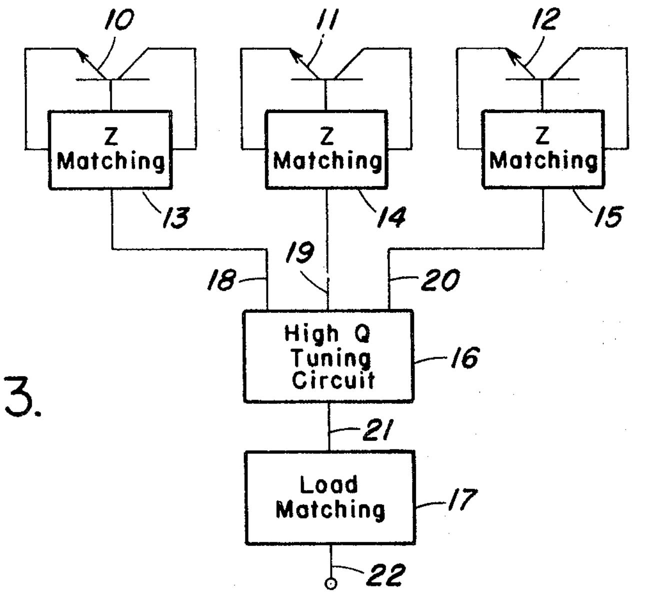
Figure 4:
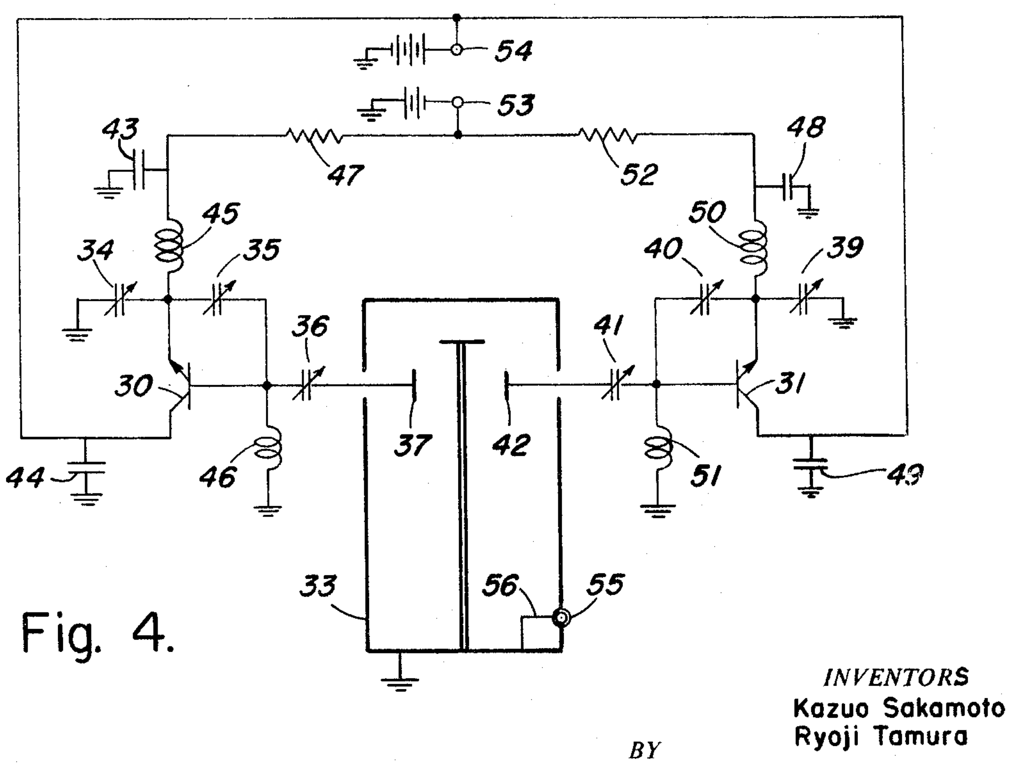

In accordance with this invention, oscillator apparatus is provided wherein a plurality of transistor means are each connected to impedance matching means to form a plurality of parallel, power sharing branches, each of said power sharing branches is then connected to load matching means through tuning circuit means, adapted to determine the frequency of said oscillator apparatus, whereby the power output of said oscillator apparatus will be equally shared by each of said plurality of transistor means. The invention will be more clearly understood by reference to the following detailed description of several embodiments thereof in conjunction with the accompanying drawings in which:

FIG. 1 schematically illustrates conventional vacuum tube oscillator apparatus in accordance with the teachings of the prior art;

FIG. 2 schematically shows a transistorized equivalent of the oscillator apparatus depicted in the FIG. 1 circuit;

FIG. 3 schematically illustrates a first embodiment of oscillator apparatus in accordance with the present invention; and FIG. 4 shows a circuit diagram of another embodiment of the oscillator apparatus according to the present invention.

Referring now to the drawings and more particularly to FIG. 1 thereof, there is shown a schematic circuit diagram of conventional vacuum tube oscillator apparatus including a plurality of vacuum tubes connected in parallel. The conventional high power oscillator apparatus depicted in FIG. 1 comprises a plurality of vacuum tubes 1—3, tuned energy feedback circuit means 4, and load matching circuit means 5. The plurality of vacuum tubes 1—3 are connected in parallel with one another in the manner shown so that each of the cathodes, each of the grids, and each of the plates, respectively, of the vacuum tubes 1—3 are connected to common terminals of the tuned energy feedback circuit means 4. The plurality of vacuum tubes 1—3, thus connected in parallel, serve as a high power vacuum tube connected to tuned energy feedback circuit means 4. The tuned energy feedback circuit means 4 is connected at an output terminal thereof to a load matching circuit means 5 which acts in the well-known manner to match the output of the tuned energy feedback circuit means 4 to the input impedance of a load (not shown) to thereby provide or maximum power transfer. The output power of the depicted high power oscillator apparatus is derived from the output terminal 6 of the load matching circuit means 5. To maintain the simplicity of this description, the appropriate bias circuits for the plurality of vacuum tubes 1—3 have not been shown.

Although the operation of the conventional oscillator apparatus depicted in FIG. 1 is considered too well known to require a detailed discussion herein, it should be noticed that as the input and output impedances of the vacuum tubes 1—3 are high and substantially equal, the vacuum tubes 1—3 will not exhibit any deleterious effects due to mismatching with the tuned energy feedback circuit means 4 and in addition thereto, such high impedances will prevent the plurality of vacuum tubes 1—3 from interacting with one another. Furthermore, as the input impedances of each of the vacuum tubes 1—3 are substantially equal, the vacuum tubes 1—3 will equally share in providing the total output power of the depicted, prior art oscillator apparatus. Thus, it will follow that any number of vacuum tubes may be connected in parallel in the oscillator apparatus depicted in FIG. 1 depending upon the output power desired.

FIG. 2 is a schematic representation of a transistorized equivalent of the conventional oscillator apparatus depicted in FIG. 1. The oscillator apparatus depicted in FIG. 2 comprises a plurality of transistor means 7—9, tuned energy feedback circuit means 4 and load matching circuit means 5. The plurality of transistor means 7—9 are connected, as shown, in parallel with one another so that each of the bases, each of the emitters, and each of the collectors, respectively, thereof are connected to common terminals of the tuned energy feedback circuit means 4. The plurality of transistors 7—9, thus connected in parallel, are intended to serve as a high power transistor means connected to the tuned energy feedback circuit means 4. The tuned energy feedback circuit means 4, which may take the same form as that described in conjunction with FIG. 1 and hence bears the same reference numeral thereat, is connected at an output terminal thereof to load matching circuit means 5. The load matching circuit means 5, which again may take the same form as that illustrated in FIG. 1, acts in an impedance matching role so that maximum power transfer between the tuned energy feedback circuit means 4 and the load which will be connected to output terminal 6 of the load matching circuit means 5 will take place.

In the operation of the oscillator apparatus depicted in FIG. 2, the individual outputs of the transistor means 7—9 are adapted to be combined by the tuned energy feedback circuit means 4 and applied thereby to output terminal 6 through the load matching circuit means 5. In contrast to the vacuum tube oscillator apparatus depicted in FIG. 1, however, the input and output impedances of the transistors 7—9 are low and vary from one transistor to another. Furthermore, the nonuniformities in the input and output impedances of the transistor means 7—9 will be especially pronounced in high frequency regions of operation. Therefore, if the oscillator apparatus depicted in FIG. 2 is intended for high frequency, high power applications, when common voltages are applied across the commonly connected input electrodes of the transistor means 7—9 connected to the same output terminals of the tuned energy feedback circuit means 4, the current will vary among the transistor means 7—9 in proportion to the input and output impedances and thus the power output and power consumption of the oscillator apparatus will be unequally shared among transistor means 7—9. Thus, if it is assumed, for instance, that the transistor means 7 has a smaller power output share and a greater power consumption share than the remainder of the transistor means 8 and 9, and that the power consumption taking place in transistor means 7 tends to increase to thereby decrease its reliability, it will be seen that in the worst case, the transistor means 7 will break down. Accordingly, it will be seen that it is virtually impossible to obtain high power outputs from transistorized oscillator apparatus designed in accordance with conventional techniques because the equal allotment of output power as well as equality in the power consumed by each transistor present in such oscillator apparatus is not readily achievable with the design criteria presently available in the pertinent body of prior art.

Turning now to FIG. 3, there is shown a schematic illustration of a first embodiment of the oscillator apparatus according to the present invention. The embodiment of the oscillator apparatus shown in FIG. 3 comprises a plurality of transistor means 10—12, a plurality of impedance matching means 13—15, high Q tuning circuit means 16, and a load matching circuit means 17. The plurality of transistor means 10—12 shown in FIG. 3 may generally be considered to be of the high frequency variety well known to those of ordinary skill in the art, and may take either the NPN form of devices illustrated or alternately comprise PNP devices. Each of the plurality of transistor means 10—12 is connected to one of the plurality of impedance matching means 13—15, so that each transistor means 10—12 in combination with its associated impedance matching means 13—15, respectively, forms a power sharing branch of the depicted oscillator apparatus which contains a plurality of such power sharing branches. To maintain the simplicity of this description, none of the biasing circuits normally associated with the various electrodes of the transistor means 10—12 has been shown; however, it will be obvious to those of ordinary skill in the art that the symmetrical connection of each of the transistor means 10—12 to its respective impedance matching means 13—15 will, in actuality, including appropriate biasing circuits or alternatively such appropriate biasing circuits may be included directly within the impedance matching means 13—15. The plurality of impedance matching means 13—15 may take the form of any of the well-known class of circuits normally used to match impedances between associated devices to thereby achieve maximum power transfer. As will become apparent subsequently, since the plurality of impedance matching circuit means 13—15 will only be required to match the resistance between the transistor means 10—12 and the high Q tuning circuit means 16, the design requirements of the plurality of impedance matching circuit means 13—15 are not highly critical.

The base, collector and emitter electrodes of the respective transistor means 10—12 are each connected, in the manner shown, to a commonly positioned terminal of the respective ones of said impedance matching means 13—15 whereby the electrical connections and hence the electrical circuits present in each of the plurality of power sharing branches are the same. Each of the power sharing branches thus formed, is connected to the high Q tuning circuit means 16 via conductors 18—20 which are connected between the respective impedance matching means 13—15, and the high Q tuning circuit means 16. The high Q turning circuit means 16 comprises a tuned circuit having a sufficiently high loaded Q, as compared with the loaded Q of the plurality of impedance matching means 13—15 and the load matching circuit means 17, to enable the effect of the plurality of impedance matching means 13—15 and the load matching circuit means 17 on the oscillation frequency to be neglected. In this regard, it should be noted that in order to raise the loaded Q of the high Q tuning circuit 16, the unloaded or virtual Q of the high Q tuning circuit means 16 is selected to be substantial despite the inevitable increase in the insertion loss caused by such selection. The transistor means 10—12, the impedance matching means 13—15, as formed into the power sharing branches described above, and the high Q tuning circuit means 16 form the oscillating circuit of the oscillator apparatus depicted in FIG. 3. The output of the oscillating circuit thus formed is applied via conductor 21 to the load matching circuit means 17 which acts in the well-known manner to provide maximum power transfer between the output of the high Q tuned circuit means 16 and the load adapted to be connected to the depicted oscillator apparatus. The load matching circuit means 17 may take any of the forms of such devices which are well known to those of ordinary skill in the art. The output of the oscillator apparatus depicted in FIG. 3 is thus presented at the output terminal 22 whereat a load may be connected thereto. Although the actual number of transistor means 10—12, and thus the power sharing branch circuits formed thereby have been illustrated in the exemplary embodiment of the oscillator apparatus depicted in FIG. 3 as three, it should be clearly understood that any number of transistor means and hence branching circuits may be utilized depending on the magnitude of the power sought to be derived from the depicted oscillator apparatus.

In the operation of the embodiment of the invention illustrated in FIG. 3, since the loaded Q of the high Q tuning circuit means 16 is sufficiently high, when compared with the loaded Q of the plurality of impedance matching means 13—15 and the load matching circuit means 17, so that the effects of these means on the oscillation frequency may be ignored, the oscillation frequency of the depicted oscillation apparatus will be determined solely by the tuning frequency of the high Q tuning circuit means 16 independently of the impedance matching means 13—15 and the load matching circuit means 17. Thus, since the oscillation frequency of the oscillator apparatus is determined by the resonant frequency of the high Q tuning circuit means 16, the impedance matching means 13—15 are virtually isolated from the load matching circuit means 17, and the reactive portions of the impedance of the oscillator apparatus will be maintained at a constant level by the high Q tuning circuit means 16 despite any variations in the reactive portions of the impedances of the impedance matching means 13—15 and the load matching means 17. In addition, due to the high value of loaded Q relied upon for the high Q tuning circuit means 16, no tuned feedback circuits will be formed by the impedance matching means 13—15 and/or the load matching means 17 to vary the oscillation frequency of the oscillation apparatus illustrated in FIG. 3 or to introduce spurious oscillations thereinto. Consequently, as the oscillation frequency of the depicted oscillator apparatus depends only upon the high Q tuning circuit means 16, the oscillator apparatus illustrated in FIG. 3 will be quite stable despite variations in the source voltage and load.

Because, as previously mentioned, the loaded Q of the high Q tuning circuit means 16 dictates the frequency of the oscillator apparatus and maintains the reactive portion of the impedance of the oscillator apparatus constant, any adjustments made to the impedance matching means 13—15 or the load matching circuit means 17 will only be effective to vary the resistive portion of the impedances of the oscillation circuit. Therefore, the individual impedance matching means 13—15 may be separately and individually adjusted to provide an impedance match between the transistor means 10—12, respectively, present in each of the power sharing branches and the respective inputs to the high Q tuning circuit means 16. Accordingly, individual impedance matching adjustments are initially carried out at each of the impedance matching means 13—15 and since such adjustments involve essentially only resistance, the separate adjustments may be easily accomplished without appreciable interaction between the respective transistor means 10—12 present in each of the power sharing branches. The illustrated oscillation apparatus may thus be initially adjusted in the foregoing manner whereby the power consumption and power output of each of the transistor means 10—12 may be made virtually identical so that absolute equality is maintained among the various power sharing branches present therein. Thus, when the oscillator apparatus depicted in FIG. 3 is energized and oscillations are initiated in the well-known manner, the isolation between the various transistor means 10—12 present therein, as well as the isolation between the plurality of impedance matching means 13—15 and the load matching circuit means 17, due to the presence of the high Q tuned circuit means 16, enables the equal allotment of output power as well as the equal apportionment of power consumption among each of said transistor means 10—12. Therefore, it will be seen that the transistorized oscillator apparatus depicted in FIG. 3 will readily admit of high frequency, high power operation.

FIG. 4 is a schematic circuit diagram of a detailed embodiment of oscillator apparatus inn accordance with the teachings of the present invention. In the embodiment of this invention depicted in FIG. 4, the illustrated oscillator apparatus has been shown as including only two transistor means so that the simplicity of this disclosure may be maintained and simplified drawings may be relied upon; however, as will be readily apparent to those of ordinary skill in the art, the number of transistor means employed will be a function of the desired power output and accordingly additional transistor means and impedance matching means may be incorporated in the basic circuit of FIG. 4 without substantial deviation from the concepts of the invention disclosed herein. The embodiment of the oscillator apparatus depicted in FIG. 4 comprised first and second transistor means 30 and 31 and high Q tuned circuit means in the form of semicoaxial cavity resonator means 33. The first and second transistor means 30 and 31 are preferably of the high frequency variety, well known to those of ordinary skill in the art, and may take the form of the NPN devices illustrated or, in the alternative, PNP devices may be used, whereupon the voltage polarities mentioned hereinafter, as the description of this embodiment proceeds, would be reversed in the usual manner. The first transistor means 30 is coupled to the semicoaxial cavity resonator means 33 through a first impedance matching circuit means which is here illustrated as comprising variable capacitors 34—36 and the coupling disc 37. Similarly, the second transistor means 31 is coupled to the semicoaxial cavity resonator means 33 through a second impedance matching circuit means, shown in FIG. 4 as including variable capacitors 39—41 and the coupling disc 42. The first transistor means 30 is appropriately biased by the circuits formed by the bypass capacitors 43 and 44, the choke coils 45 and 46 and the resistor 47. In like manner, the second transistor means 31 is provided with biasing means in the form of bypass capacitors 48 and 49, choke coils 50 and 51, and the resistor 52. The first and second transistor means 30 and 31 are each adapted to receive biasing potential from one or more common sources connected to terminals 53 and 54 so that a first junction of each of said transistor means 30 and 31 will be forward biased by the potential applied to terminal 53, while a second junction of each of said transistor means 30 and 31 will be reversely biased by potential of an opposite polarity applied to terminal 54. The current flowing in each of the transistor means 30 and 31 from the potential applied to terminals 53 and 54 will be appropriately limited in the usual manner by the resistors 47 and 52, respectively, present in emitter circuits thereof. Thus, it will be seen that the first and second transistor means 30 and 31, the respective biasing circuits therefor, and the first and second impedance matching circuit means respectively form first and second power sharing branches which, in similar manner to the block diagram of the embodiment of the invention depicted in FIG. 3, are each connected to the high Q tuning circuit means 33.

As was mentioned above, the first and second transistor means 30 and 31 are coupled to the semicoaxial cavity resonator means 33 by the first and second impedance matching circuit means illustrated in FIG. 4 as comprising the variable capacitors 34—36 and the coupling disc 37 and the variable capacitors 39—41 and the coupling disc 42, respectively. The semicoaxial cavity resonator means 33 utilized for the high Q tuned circuit means in the FIG. 4 embodiment of the present invention, may take any form of such devices well known to those of ordinary skill in the art. For instance, the enclosure which forms the semicoaxial cavity resonator means 33 may be formed of super invar having a linear thermal expansion coefficient so that variations in the resonance frequency thereof, due to ambient temperature changes, will be small whereby the depicted oscillator apparatus is stabilized as to variations in the temperature as well as variations in the source voltage and load. The output power of the semicoaxial cavity resonator means 33 is derived from the output terminal means 55 thereof which receives the output power present in the semicoaxial cavity resonator means 33 via the coupling loop 56. The output terminal means 55 is adapted to be connected in the usual manner to an external load or other utilization circuit which is to be driven by the depicted oscillator apparatus. The loaded Q of the semicoaxial cavity resonator means 33 is again selected to be substantially higher than the loaded Q of the first or second impedance matching circuit means, as defined above, or the coupling loop 56 and such high values of loaded Q may again be assured by the utilization of a high Q tuned circuit means having a substantial unloaded or virtual Q. The semicoaxial resonant cavity means 33 and the first and second impedance matching circuit means, as defined above, constitute the frequency defining feedback circuit means for the oscillator apparatus illustrated in FIG. 4.

In the operation of the oscillator apparatus depicted in FIG. 4, as the first and second impedance matching circuit means, as defined above, and the coupling loop 56 exhibit substantially lower values of loaded Q than the semicoaxial cavity resonator means 33, the oscillation frequency of the illustrated oscillator apparatus will be determined solely by the resonant frequency of the semicoaxial cavity resonator 33. Therefore, as was the case in the previously described FIG. 3 embodiment of the present invention, there will be virtually no variation in the reactive portion of the overall impedance of the oscillator apparatus depicted in FIG. 4 due to the high value of loaded Q manifested by the semicoaxial cavity resonator means 33. Thus, when the variable impedance elements of the first and second impedance matching means, which here comprise variable capacitors 34—36 and 39—41, respectively, are varied in order to accomplish impedance matching, only the resistive portion of the overall impedance of oscillator apparatus according to this invention will be changed. Furthermore, as was the case in the FIG. 3 embodiment of the present invention, an adjustment of the impedance matching means present in one of the power sharing branch circuits, as defined above, will have virtually no effect on the other power sharing branches present in the depicted oscillator apparatus due to the high value of loaded Q exhibited by the semicoaxial cavity resonator means 33 here utilized as the high Q tuned circuit means.

Therefore, as the loaded Q of the semicoaxial cavity resonator means 33 determines the frequency of the oscillator apparatus and maintains the reactive portion of the impedance of the oscillator apparatus constant, the variable capacitors 34—36 may be initially adjusted to provide an impedance match between the first transistor means 30 and the semicoaxial cavity resonator means 33 without any variation in the reactive portion of the impedance of the depicted oscillator apparatus. Thus, as the adjustment of variable capacitors 34—36 will only vary the resistive portion of the overall impedance of the oscillator apparatus and will not adversely effect the second transistor means 27, it will follow that impedance matching in the first power sharing branch may be quickly and easily accomplished independently for the other power sharing branch. Similarly, the variable capacitors 39—41 present in the second impedance matching circuit means, as previously defined, may be subsequently adjusted to provide an impedance match between the second transistor means 31 and the semicoaxial cavity resonator means 33 without any variation in the reactive portion of the overall impedance of the oscillator apparatus. As the adjustment of variable capacitors 39—41 will also only vary the resistive portion of the overall impedance of the illustrated oscillator apparatus, an impedance match may be established between the second transistor means 31 and the semicoaxial cavity resonator means 33 without any adverse effect on the initially adjusted, first power sharing branch defined above. Accordingly, it will be seen that as each of the first and second transistor means 30 and 31 may be separately and individually matched in impedance to the semicoaxial cavity resonator means 33, the total output power derived from the depicted oscillator apparatus and the power consumed by each of the first and second power sharing branches may be equally divided between the transistor means 30 and 31 when the oscillator means is subsequently energized and driven into oscillation in the well-known manner. Further, as the loaded Q of the semicoaxial cavity resonator means 33 is so substantial as compared with those present in the coupling circuits utilized therewith, the high loaded Q manifested thereby will define the frequency of the depicted oscillator apparatus and no tuned feedback circuits will be formed in such oscillator apparatus which cause the output frequency to vary or to include spurious oscillations. Thus, it will be seen that the oscillator apparatus depicted in FIG. 4 is stable in operation and is particularly well adapted for high frequency, high power applications.

Although the embodiment of the invention described in conjunction with FIG. 4 has been illustrated in conjunction with only two transistor means 30 and 31, it should be clearly understood that any number of transistor means may be relied upon depending upon the desired power level of the oscillator apparatus under consideration. Furthermore, if more than two transistor means are utilized in oscillator apparatus designed according to the FIG. 4 embodiment, the mode of operation and the mode of adjustment thereof will be substantially as described in conjunction with FIG. 4.

While the invention has been described in connection with several exemplary embodiments thereof, it will be understood that many modifications will be readily apparent to those of ordinary skill in the art; and that this application is intended to cover any adaptations or variations thereof. Therefore, it is manifestly intended that this invention be only limited by the claims and the equivalents thereof.

What we claim is:

1. Oscillator apparatus comprising:
a plurality of transistor means;
a plurality of impedance matching means, each of said plurality of impedance matching means being connected to an associated one of said plurality of transistor means respectively;
load matching circuit means for receiving output signals from each of said plurality of transistor means through respective ones of said plurality of impedance matching means when said plurality of transistor means are energized and adapted to apply said output signals to load means to be energized; and
high Q tuned circuit means electrically connected intermediate said plurality of impedance matching means and said load matching circuit means, said high Q tuned circuit means exhibiting a value of loaded Q which is sufficient to substantially determine the oscillation frequency of said oscillator apparatus independently of the values of loaded Q exhibited by each of said plurality of impedance matching means and said load matching circuit means, each of said plurality of impedance matching means being individually adjustable and connected to input means present in said high Q tuned circuit means to thereby match the output impedance of the respective transistor means connected thereto to the input impedance of said input means present in said high Q tuned circuit means whereby each of said plurality of transistor means in combination with respective ones of said plurality of impedance matching means form individual power sharing branch circuits, said plurality of impedance matching means serving to match at least the resistance exhibited by the transistor means associated therewith to said high Q tuned circuit means and said load circuit means serving to provide appropriate power transfer.

2. The apparatus of claim 1 wherein the adjustment of said plurality of impedance matching means is effective to vary only the resistive portion of the overall impedance of said oscillator apparatus.

3. The apparatus of claim 2 wherein the adjustment of one of said plurality of impedance matching means is effective to match the output impedance of the transistor means connected thereto with the input impedance of said input means present in said high Q tuning circuit means but ineffective to cause adverse effects in any of said plurality of transistor means connected to others of said plurality of impedance matching means.

4. The apparatus of claim 3 wherein each of said plurality of impedance matching means is electrically isolated from said load matching circuit means by said high Q tuning circuit means.

5. The apparatus of claim 4 wherein said high Q tuning circuit means comprises cavity resonator means.

6. The apparatus of claim 5 wherein said cavity resonator means comprises semicoaxial cavity resonator means.

7. The apparatus of claim 6 wherein each of said plurality of impedance matching means comprises variable reactance means and a coupling disc means.

8. The apparatus of claim 7 wherein said variable reactance means comprises a plurality of variable capacitor means.

9. The apparatus of claim 8 wherein each of said plurality of transistor means are adapted to be energized from a common source of potential.

10. The apparatus of claim 9 wherein each of said plurality of transistor means is provided with separate biasing circuit means whereby each of said individual power sharing branch circuits is electrically similar and connected in parallel.

11. The apparatus of claim 10 wherein each of said plurality of transistor means is connected to its respective impedance matching means at the base electrode thereof.